(12) United States Patent
Kano et al.

(10) Patent No.: US 6,260,898 B1
(45) Date of Patent: Jul. 17, 2001

(54) MOUNTING HEAD FOR ELECTRONIC COMPONENT-MOUNTING APPARATUS

(75) Inventors: Yoshinori Kano; Yoshinao Usui; Ikuo Takemura; Takahiro Nagata, all of Gunma-ken (JP)

(73) Assignee: Sanyo Electric Co., Ltd., Osaka-Fu (JP)

(*) Notice: Subject to any disclaimer, the term of this patent is extended or adjusted under 35 U.S.C. 154(b) by 0 days.

(21) Appl. No.: 09/632,876

(22) Filed: Aug. 4, 2000

(30) Foreign Application Priority Data

Aug. 6, 1999 (JP) .................................. 11-223355

(51) Int. Cl.[7] .............................. B25J 15/06; H05K 13/04
(52) U.S. Cl. .............................. 294/64.1; 29/740; 29/743
(58) Field of Search .................................. 294/64.1, 64.2, 294/64.3, 65, 907; 29/740, 743, DIG. 44; 414/737, 752.1; 901/40, 46

(56) References Cited

U.S. PATENT DOCUMENTS

| | | | |
|---|---|---|---|
| 4,794,689 | * | 1/1989 | Seno et al. .............................. 29/740 |
| 4,905,370 | * | 3/1990 | Hineno et al. ....................... 294/64.1 |
| 5,588,195 | * | 12/1996 | Asai et al. .............................. 29/740 |
| 5,628,107 | * | 5/1997 | Nushiyama et al. ................. 294/64.1 |
| 5,784,778 | * | 7/1998 | Yoshida et al. ........................ 29/834 |
| 6,101,707 | * | 8/2000 | Kano et al. ............................ 29/743 |

FOREIGN PATENT DOCUMENTS 5226884  9/1993 (JP).

* cited by examiner

Primary Examiner—Dean J. Kramer
(74) Attorney, Agent, or Firm—Darby & Darby

(57) ABSTRACT

There is provided a mounting head for an electronic component-mounting apparatus. A nozzle holder has a plurality of vacuum nozzles arranged circumferentially about an axis thereof in a manner such that each vacuum nozzle is capable of projecting from the nozzle holder and retracting in the nozzle holder. A holder support member supports the nozzle holder in a manner such that the nozzle holder can rotate about the axis thereof. A nozzle-rotating motor drives the nozzle holder about the axis thereof for rotation in normal and reverse directions. The nozzle holder is driven for rotation by the nozzle-rotating motor to bring one of the vacuum nozzles selected for use to a projecting position. The selected one is caused to project from a lower end face of the nozzle holder at the projecting position. A plurality of cam followers are mounted at respective upper portions of the vacuum nozzles. The cam followers are in contact with an annular end cam in a manner such that the cam flowers can move on the annular end cam. The annular end cam is formed with a nozzle-projecting surface for causing the selected one of the vacuum nozzles to project from the nozzle holder when the selected one of the vacuum nozzles is at the projecting position. A cam-rotating motor drives the end cam for rotation about an axis of the end cam in normal and reverse directions.

7 Claims, 4 Drawing Sheets

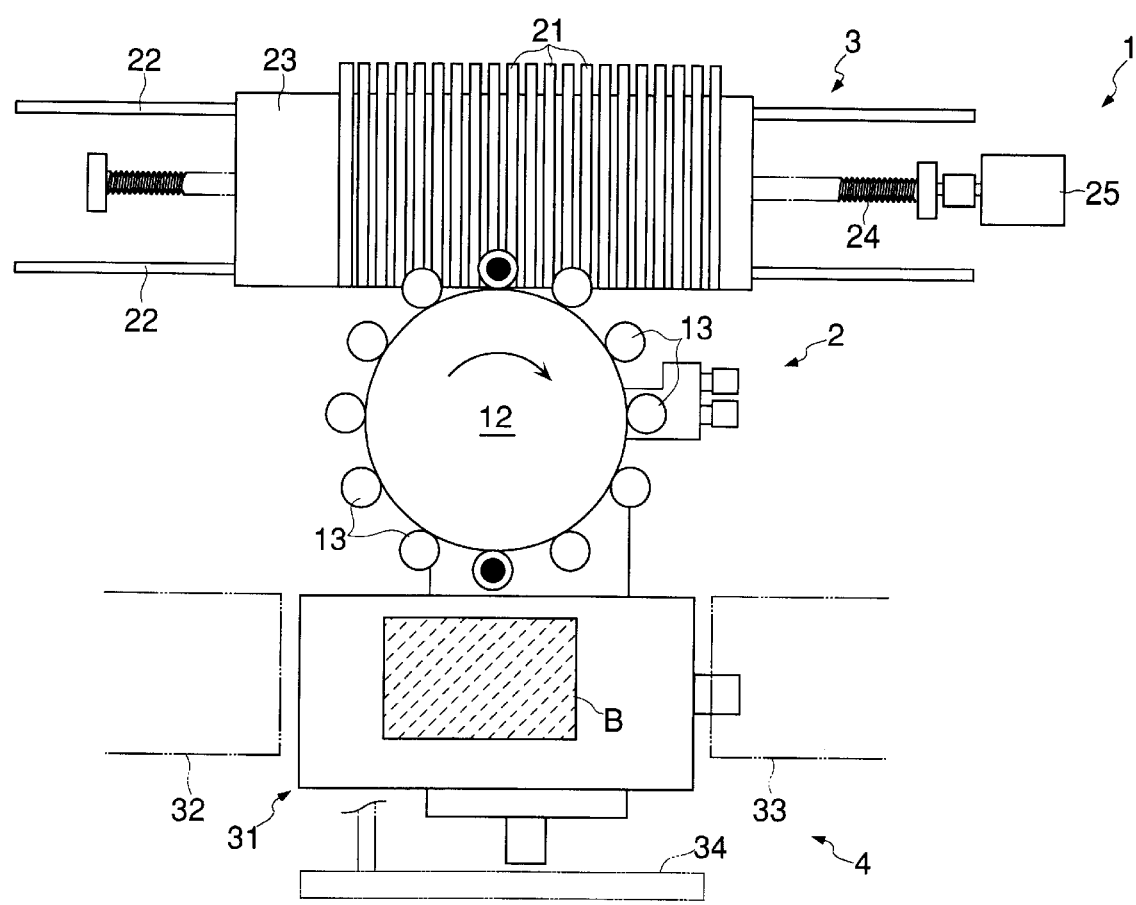
F I G. 2

F I G. 4
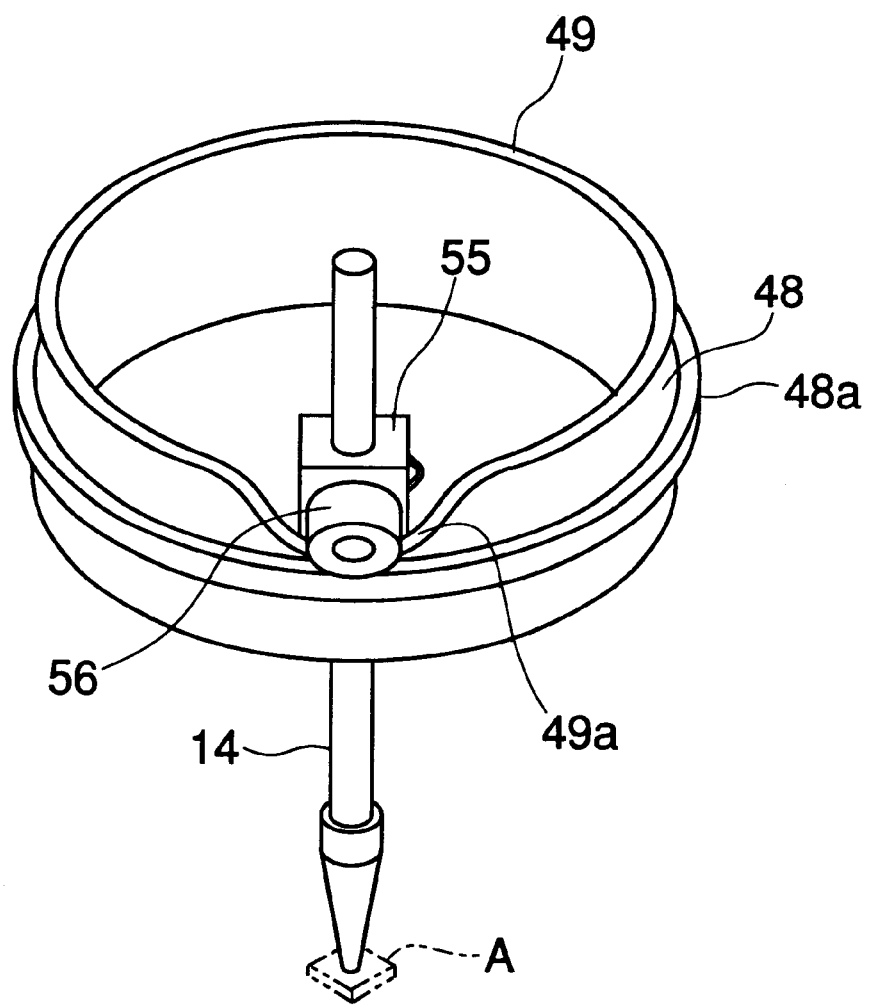

MOUNTING HEAD FOR ELECTRONIC COMPONENT-MOUNTING APPARATUS

BACKGROUND OF THE INVENTION

1. Field of the Invention

This invention relates to a mounting head for an electronic component-mounting apparatus that picks up electronic components by vacuum and mounts the electronic components on a circuit board.

2. Prior Art

Conventionally, a mounting head for an electronic component-mounting apparatus of this kind has been proposed in Japanese Laid-Open Patent Publication (Kokai) No. 5-226884, which includes a nozzle holder having a plurality of vacuum nozzles mounted thereon in a manner capable of projecting and retracting vertically, and a holder support member secured to a bracket mounted on a main unit of the electronic component-mounting apparatus, for rotatably supporting the nozzle holder via a pair of upper and lower bearings. The nozzle holder has a hook support member mounted at an upper portion thereof. The hook support member has a plurality of engaging hooks corresponding to the vacuum nozzles, respectively, and extending perpendicularly downward therefrom in a pivotally movable manner. Further, the hook support member has an upper end surface thereof formed with an engaging groove for engagement with an output end of a rotation drive mechanism arranged in the main unit. That is, the output end of the rotation drive mechanism engages with the engaging groove to drive the nozzle holder for rotation, whereby one of the vacuum nozzles selected for use is brought to a projecting position.

Each of the vacuum nozzles has a hook-catching member fixed to an upper portion thereof for engagement with a corresponding one of the engaging hooks. Retraction of the vacuum nozzles into the nozzle holder is effected by lowering the mounting head and causing the vacuum nozzles to strike against a nozzle stopper, while downward projection of a selected vacuum nozzle from the nozzle holder is effected by pivotally moving a corresponding one of the engaging hooks by a disengaging mechanism provided in the main unit, to disengage the engaging hook from a corresponding one of the hook-catching members. That is, in changing (switching) vacuum nozzles in use, the nozzle holder is rotated to bring a vacuum nozzle selected for use in a next mounting operation to a projecting position, then all the vacuum nozzles are struck against the nozzle stopper to be once retracted into the nozzle holder, and thereafter, only the selected vacuum nozzle is caused to project.

As described above, in the conventional mounting head, all the vacuum nozzles are required to be struck against the stopper before causing one of the vacuum nozzles to project for use. Since this operation is repeatedly carried out, the striking end of each vacuum nozzle is worn away or deformed, which inevitably shortens the service life of the vacuum nozzle.

SUMMARY OF THE INVENTION

It is an object of the invention to provide a mounting head for an electronic component-mounting apparatus, which is capable of increasing the service life of vacuum nozzles, without causing any trouble in changing between them.

To attain the above object, the present invention provides a mounting head for an electronic component-mounting apparatus, including a nozzle holder having a plurality of vacuum nozzles arranged circumferentially about an axis thereof in a manner such that each vacuum nozzle is capable of projecting from the nozzle holder and retracting in the nozzle holder, a holder support member supporting the nozzle holder in a manner such that the nozzle holder can rotate about the axis thereof, and main rotation drive means for driving the nozzle holder about the axis thereof for rotation in normal and reverse directions, wherein the nozzle holder is rotated by the main rotation drive means to bring one of the vacuum nozzles selected for use to a projecting position, and the selected one is caused to project from a lower end face of the nozzle holder at the projecting position.

The mounting head according to the present invention is characterized by comprising a plurality of cam followers mounted at respective upper portions of the vacuum nozzles, an annular end cam with which the cam followers are in contact in a manner such that the cam followers can move on the annular end cam, the annular end cam being formed with a nozzle-projecting surface for causing the selected one of the vacuum nozzles to project from the lower end face of the nozzle holder when the selected one of the vacuum nozzles is at the projecting position, and auxiliary rotation drive means for driving the end cam for rotation about an axis of the end cam in normal and reverse directions.

According to this electronic component-mounting apparatus, the nozzle holder is driven for rotation by the main rotation drive means, whereby the vacuum nozzles arranged through the nozzle holder in a manner capable of projecting downward and retracting upward are moved about the axis of the nozzle holder. The movement of each of the vacuum nozzles causes a cam follower mounted at the upper portion of the vacuum nozzle to move on a cam surface of the annular end cam. During this process, any one of the vacuum nozzles which is brought to the nozzle-projecting surface of the end cam is caused to project from the lower end face of the nozzle holder by cam action between the cam follower and the end cam, while the other vacuum nozzles on part of the cam surface other than the nozzle-projecting surface are each held in a retracted state. On the other hand, the end cam is driven for rotation by the auxiliary rotation drive means so as to move the nozzle-projecting surface of the end cam to a desired projecting position, whereby it is possible to cause only one of the vacuum nozzles selected for use to project at the desired projecting position. Further, since the two rotation drive means can be each selectively rotated in a normal or reverse direction through the smaller rotational angle with respect to a predetermined rotational position, the nozzle holder and the end cam can be promptly rotated to respective predetermined positions.

Preferably, the main rotation drive means and the auxiliary rotation drive means are each formed by a stepping motor or a servomotor, the auxiliary rotation drive means being interposed between the holder support member and a lower portion of the end cam.

According to this preferred embodiment, since the main rotation drive means and the auxiliary rotation drive means are each formed by a stepping motor or a servomotor, the end cam is driven for rotation by the auxiliary rotation drive means so as to move the nozzle-projecting surface of the end cam to a desired projecting position in advance, and then, in a state of the nozzle-projecting surface being held at the position by the auxiliary rotation drive means maintained in its energized state, the nozzle holder is driven for rotation by the main rotation drive means so as to bring the selected vacuum nozzle (i.e. the cam follower thereof) to the position of the nozzle-projecting surface (i.e. the projecting position), whereby it is possible to cause the vacuum nozzle to project at the desired projecting position.

Preferably, the mounting head further comprises cam position-detecting means for detecting a rotational position of the nozzle-projecting surface of the end cam, nozzle position-detecting means for detecting a rotational position of each of the vacuum nozzles on the nozzle holder, and control means for controlling rotation of the main rotation drive means and rotation of the auxiliary rotation drive means, in response to respective detection signals from the cam position-detecting means and the nozzle position-detecting means.

According to this preferred embodiment, it is possible to always keep track of the rotational position of the nozzle-projecting surface and the rotational position of each of the vacuum nozzles with reference to results of detection by the cam position-detecting means and the nozzle position-detecting means, so that the two rotation drive means can be each rotated under control of the control means in the normal or reverse direction through the smaller rotational angle with respect to the predetermined rotational position, whereby it is possible to move the nozzle-projecting surface to a desired projecting position and bring a desired or selected one of the vacuum nozzles to the nozzle-projecting surface. This makes it possible to automatically and easily cause projection of the vacuum nozzle selected for use.

Preferably, the mounting head includes an inner bearing and an outer bearing fixedly arranged between the nozzle holder and the holder support member for supporting the lower portion of the end cam in a manner such that the lower portion of the end cam is sandwiched between the inner bearing and the outer bearing, and the end cam has an inner peripheral surface, an outer peripheral surface, and an annular lug formed around at least one of the inner peripheral surface and the outer peripheral surface, the lug abutting from above on a corresponding one of the inner bearing and the outer bearing.

Preferably, each of the vacuum nozzles has an upper intermediate portion and a support block fixed to the upper intermediate portion, and the cam follower is rotatably supported by the cam follower such that the cam follow is in rolling contact with the end cam.

More preferably, the mounting head includes a passage member secured to an upper end face of the nozzle holder, a nozzle guide member secured to an end of the passage member and having a vacuum passage formed along an axis thereof, and a compression spring interposed between the nozzle guide member and the support block of the each of the vacuum nozzles, the compression spring urging the each of the vacuum nozzles in a protruding direction, and at the same time causing the cam follower to be brought into positive rolling contact with the end cam.

The above and other objects, features, and advantages of the invention will become more apparent from the following detailed description taken in conjunction with the accompanying drawings.

BRIEF DESCRIPTION OF THE DRAWINGS

FIG. 2 is a plan view of the FIG. 1 electronic component-mounting apparatus;

FIG. 4 is a perspective view showing an end cam of the FIG. 3 mounting head and component parts associated with the end cam.

DETAILED DESCRIPTION

The invention will now be described in detail with reference to drawings showing an embodiment thereof. In the embodiment, a mounting head according to the invention is installed on an electronic component-mounting apparatus.

Figure 1:
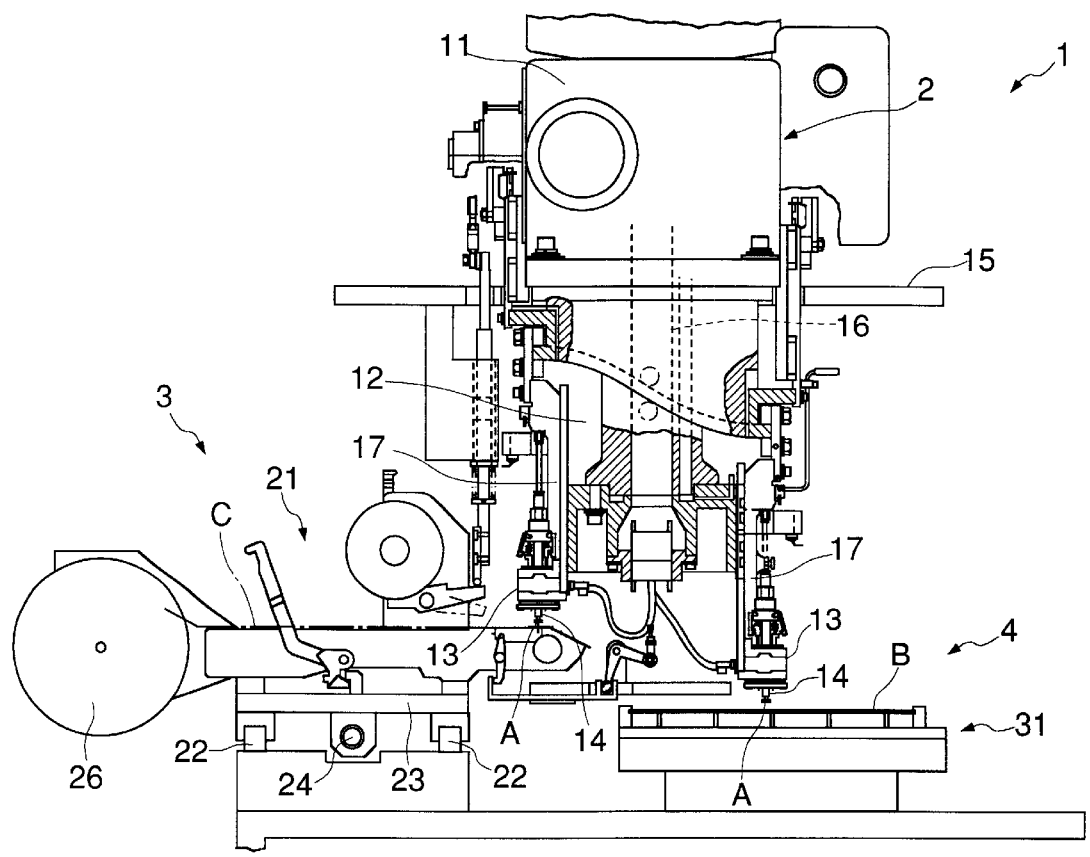
FIG. 1 is a side elevational view, partly in cross-section, and partly cut away, of an electronic component-mounting apparatus on which is mounted a mounting head according to an embodiment of the invention.

Referring first to FIGS. 1 and 2, there is shown an electronic component-mounting apparatus 1 which includes a main unit 2, a feeding section 3 for feeding electronic components A, and a mounting section 4 for mounting the electronic components A on a circuit board B, with the feeding section 3 and the mounting section 4 being arranged on opposite sides of the main unit 2 in a manner parallel to each other. The main unit 2 is comprised of an index unit 11 which forms a main part of the driving system of the apparatus, a rotary table 12 coupled thereto, and a plurality of (twelve, in the present embodiment) mounting heads 13 arranged on the outer periphery of the rotary table 12. The rotary table 12 is intermittently rotated by the index unit 11 in angular increments corresponding to the number of the mounting heads 13. With intermittent rotation of the rotary table 12, a selected one of vacuum nozzles 14 carried by each mounting head 13 is properly brought to the feeding section 3 and the mounting section 4, whereby each selected vacuum nozzle 14 picks up by vacuum an electronic component A supplied at the feeding section 3, carries the same to the mounting section 4, and mounts the same on a circuit board B supplied at the mounting section 4.

The feeding section 3 has tape cassettes 21 corresponding in number to the number of kinds of electronic components A to be mounted on the circuit board B. The tape cassettes 21 are removably mounted on a feed table 23 in parallel with each other perpendicularly to the directions of forward/backward movements of the feed table 23. The feed table 23 is slidably guided by a pair of guide rails 22, 22. A ball screw 24 extends through the feed table 23 in a direction of its sliding on the guide rails 22, whereby the feed table 23 is moved forward and backward by respective normal and reverse rotations of a feed motor 25 connected to one end of the ball screw 24, to selectively bring a selected one of the tape cassettes 21 to a pickup station for the mounting heads 13. Each tape cassette 21 contains a roll of a carrier tape C which carries electronic components A thereon at intervals of a predetermined pitch and is wound around a tape reel 26, and the electronic components A are sequentially picked up by a corresponding one of the vacuum nozzles 14 by vacuum as the carrier tape C is unwound from the tape reel 26.

The mounting section 4 is comprised of an X-Y table 31 for moving a circuit board B placed thereon in the directions of an X axis and a Y axis, a feed conveyor 32 and a delivery conveyor 33 arranged to face respective opposite longitudinal ends of the X-Y table 31, and a circuit board transfer device 34 for transferring a circuit board B on the feed conveyor 32 onto the X-Y table 31 and at the same time transferring a preceding circuit board B already placed on the X-Y table onto the delivery conveyor 33. That is, the circuit board B sent to the downstream end of the feed conveyor 32 is transferred by the circuit board transfer device 34 onto the X-Y table 31, and at the same time, the preceding circuit board B having the electronic parts A mounted thereon is transferred by the circuit board transfer device 34 onto the delivery conveyor 33. The circuit board B placed on the X-Y table 31 is moved to its predetermined positions by the X-Y table 31 such that specific portions thereof are sequentially brought to a mounting station for the mounting heads 13, at which each electronic component A held at a selected vacuum nozzle 14 of each mounting head 13 is mounted at its specific portion of the circuit board B.

The index unit 11 of the main unit 2, which forms the main part of the whole driving system of the apparatus 1, is supported by a support table 15. The index unit 11 intermittently rotates the rotary table 12, and at the same time causes various devices mounted on the main unit 2 to operate in a manner synchronous with a repetition period of intermittent rotation (rotary indexing motion) of the rotary table 12.

The rotary table 12 is rigidly mounted on a vertical shaft 16 extending perpendicularly downward from the index unit 11 and is driven for clockwise intermittent rotation as viewed in FIG. 2. The twelve mounting heads 13 arranged at circumferential intervals along the periphery of the rotary table 12 are fixed to respective brackets 17 vertically movably mounted on the periphery of the rotary table 12. In the present embodiment, the rotary table 12 performs twelve intermittent rotations or indexing motions to make one complete rotational turn in a manner corresponding to the number of the mounting heads 13. The mounting heads 13, which intermittently move about the rotational axis of the rotary table 12, are sequentially brought to twelve stations including the pickup station in the feeding section 3, at which electronic components are picked up by vacuum by respective selected vacuum nozzles 14, and the mounting station in the mounting section 4, at which the picked electronic components are sequentially mounted on a circuit board B as well as a station at which an image of the picked electronic component is taken and a position thereof is corrected if required, and another station at which nozzles are changed (or switched).

Figure 3:
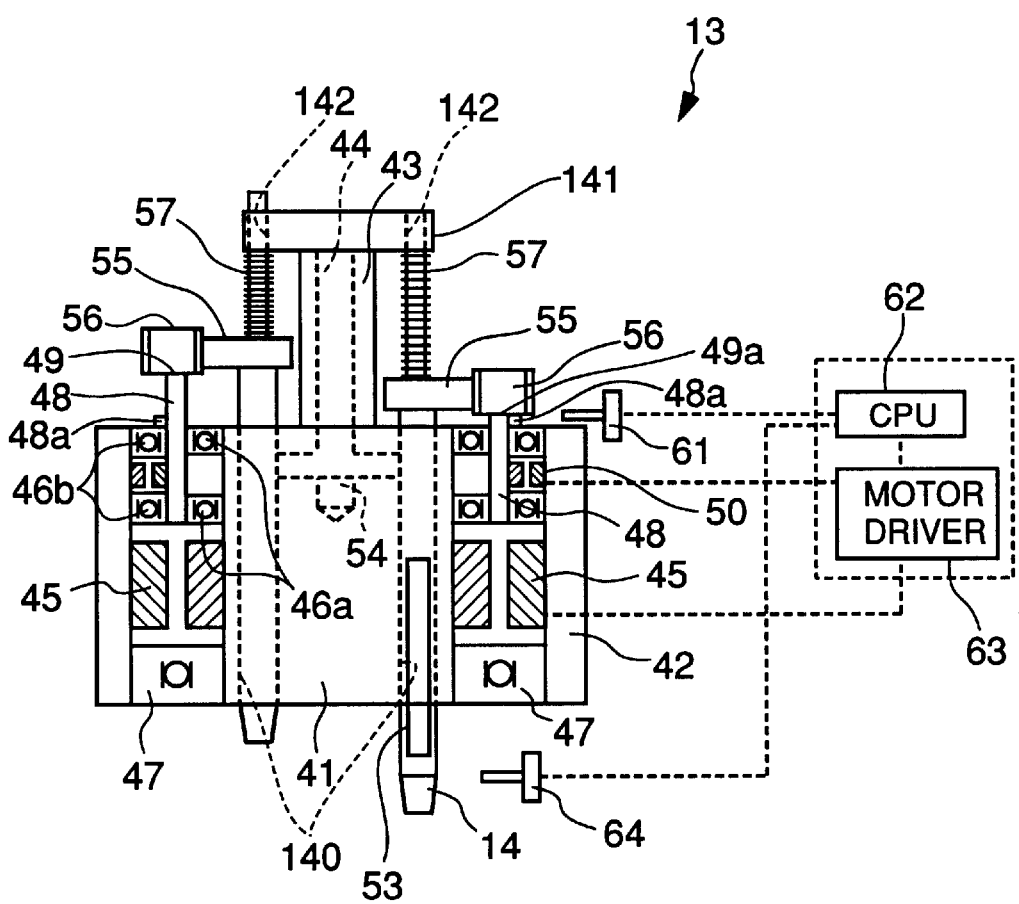
FIG. 3 is a side sectional view of the mounting head according to the embodiment.

As shown in FIG. 3, each mounting head 13 includes a nozzle holder 41 having a plurality of (five, in the present embodiment) vacuum nozzles 14 vertically arranged therethrough at circumferentially equal intervals in a manner capable of projecting downward and retracting upward, a holder support member 42 secured to the bracket 17 on the side of the main unit 2 and rotatably supporting the nozzle holder 41, and a passage member 43 mounted vertically on an upper surface of the nozzle holder 41 and having a vacuum passage 44 formed therethrough such that the passage 44 axially extends in a central portion thereof. Arranged between the nozzle holder 41 and the holder support member 42 is a nozzle-rotating motor (main rotation drive means: stepping motor) 45 which incorporates the nozzle holder 41 as a rotor and the holder support member 42 as a stator. That is, the nozzle-rotating motor 45 drives the nozzle holder 41 for rotation with respect to the holder support member 42, causing the vacuum nozzles 14 to move about the vertical axis of the nozzle holder 41.

A lower portion of an end cam 48, described in detail hereinafter, is interposed between the nozzle holder 41 and the holder support member 42. Further, arranged between the holder support member 42 and the lower portion of the end cam 48 is a cam-rotating motor (auxiliary rotation drive means: stepping motor) 50 which incorporates the end cam 48 as a rotor and the holder support member 42 as a stator. The cam-rotating motor 50 drives the end cam 48 for rotation about the vertical axis of the nozzle holder 41.

The end cam 48 for causing the vacuum nozzles 14 to project and retract vertically has an upper portion located above the holder support member 42 with the lower portion thereof received in the holder support member 42. As shown in FIGS. 3 and 4, the end cam 48 is formed to have an annular shape, and an upper end formed with a cam surface 49. At a portion of the cam surface 49, there is formed a nozzle-projecting surface 49a for lowering a vacuum nozzle 14 to cause the same to project downward from the nozzle holder 41. The lower portion of the end cam 48 is supported by a pair of inner upper bearings 46a fixedly arranged between the nozzle holder 41 and the holder support member 42 at respective upper and lower locations and a pair of outer upper bearings 46b fixedly arranged between the same and corresponding in vertical position to the pair of inner upper bearings 46a, in a manner sandwiched by these bearings 46a, 46b (actually, an annular lug 48a formed around an outer peripheral surface of the end cam 48 abuts from above on an upper end face of the outer upper bearing 46b, whereby the lower portion of the end cam 48 is held between the bearings 46a, 46b). Further, a lower bearing 47 is interposed between the holder support member 42 and the nozzle holder 41. That is, the end cam 48 and the nozzle holder 41 are each supported in a rotatable manner with respect to the holder support member 42 as the stator.

Each of the vacuum nozzles 14 is arranged such that it can move upward and downward (i.e. it can project and retract vertically), with its upper portion being guided by an upper nozzle guide hole extending through a nozzle guide member 141 secured to an upper end of the passage member 43 and its lower portion being guided by a lower nozzle guide hole 140 formed through the nozzle holder 41. The lower portion of the vacuum nozzle 14 is formed with a vacuum hole 53 extending along the vertical axis of the vacuum nozzle 14. The vacuum hole 53 has an upper end communicating with a vacuum chamber 54 formed in the nozzle holder 41. The vacuum chamber 54 communicates with the vacuum passage 44 formed through the passage member 43. Further, the vacuum nozzles 14 each have a support block 55 secured to an upper intermediate portion thereof by a screw, for supporting a cam follower 56 such that the cam follower can roll on the end cam 48.

A compression spring 57 is arranged between the nozzle guide member 141 and the support block 55 in a manner wound around the upper portion of each of the vacuum nozzles 14. The compression spring 57 urges the vacuum nozzle 14 in a projecting direction and at the same time causes the cam follower 56 to be brought into positive rolling contact with the end cam 48. When the cam follower 56 is in rolling contact with the nozzle-projecting surface 49a, the vacuum nozzle 14 is held in a projected position by the urging force of the compression spring 57, while when the cam follower 56 is in rolling contact with the other portion of the cam surface 49 than the nozzle-projecting surface 49a, the vacuum nozzle 14 is held in a retracted position against the urging force of the compression spring 57.

On the other hand, as shown in FIG. 3, each of the mounting heads 13 is provided with a cam encoder (cam position-detecting means) 61 for detecting a rotational angle of the end cam 48, more specifically, a rotational position of the nozzle-projecting surface 49a of the end cam 48. The cam encoder 61 is connected to a CPU (control means) 62 to which are connected the nozzle-rotating motor 45 and the cam-rotating motor 50 via a motor driver (control means) 63. Basically, the position of the nozzle-projecting surface 49a corresponds to a projecting position which is the absolute position of the mounting head 13. However, it often happens that the position of the nozzle-projecting surface 49a deviates from the corresponding projecting position due to correction of rotational position (correction in a θ direction) of an electronic component A picked up by the vacuum nozzle 14. The cam encoder 61 detects an angular deviation of the position of the nozzle-projecting surface 49a from the proper projecting position and causes the motor driver 63 to drive the nozzle-rotating motor 45 for compensation for the detected deviation.

The mounting head 13 is also provided with a nozzle encoder (nozzle position-detecting means) 64 for detecting a rotational angle of each of the vacuum nozzles 14 about the vertical axis of the mounting head 13, more specifically a rotational position about the vertical axis of the mounting head 13 to which the vacuum nozzle 14 is brought. The nozzle encoder 64 is also connected to the CPU 62. In order to move a desired one of the vacuum nozzles 14 to a desired position, the nozzle-rotating motor 45 is driven to cause the nozzle holder 41 to rotate in the normal or reverse direction by a predetermined number of steps, with reference to results of detection by the nozzle encoder 64.

Now, description will be made of a sequence of operations (nozzle-replacing operation) for causing a selected one of the vacuum nozzles 14 to project. First, the end cam 48 is driven for rotation by the cam-rotating motor 50. The cam-rotating motor 50 is selectively driven for normal or reverse rotation by a predetermined number of steps under control of the CPU 62 with reference to results of detection by the cam encoder 61, until the nozzle-projecting surface 49a of the end cam 48 is moved to a projecting position for causing the selected vacuum nozzle 14 to project. Thus, the nozzle-projecting surface 49a of the end cam 48 is moved to the projecting position in advance.

Then, the nozzle-rotating motor 45 is selectively driven for normal or reverse rotation by a predetermined number of steps under control of the CPU 62 with reference to results of detection by the nozzle encoder 64, whereby the nozzle holder 41 is rotated to bring the vacuum nozzle 14 selected for use to the nozzle-projecting surface 49a, i.e. to the projecting position. When brought to the nozzle-projecting surface 49a, the selected vacuum nozzle 14 is lowered by cam action on the nozzle-projecting surface 49a, and the end of the vacuum nozzle 14 is caused to project downward from the lower end face of the nozzle holder 41.

It should be noted that when electronic components A are picked up or mounted, it is possible to lift or lower the electronic components A only by a small distance by utilizing the cam action of the nozzle-projecting surface 49a of the end cam 48. In such a case, a lift cam for lifting up and down each mounting head 13 can be dispensed with.

Further, it is possible to cause a rotation of the nozzle holder 41 such that all the vacuum nozzles 14 sequentially pick up electronic components A, and then sequentially mount them. Moreover, it is possible to set the projecting position at a desired location in a circumferential direction.

As described above, according to the present embodiment, the end cam 48 and the nozzle holder 41 are driven by the two motors, respectively, for normal or reverse rotation, whereby the end cam 48 and the nozzle holder 41 can be rotated promptly to respective predetermined positions. Further, the cam action between the end cam 48 and the cam follower 56 enables only a desired vacuum nozzle 14 to project at a desired projecting position. In short, it is possible to cause a vacuum nozzle 14 selected for use to project at an appropriate position accurately and promptly. In the present embodiment, since the cam action is utilized to cause the selected vacuum nozzle to project from the nozzle holder, it is not required to strike upward the other vacuum nozzles 14 relative to the selected one, as in the prior art, so that it is possible to prevent the service life of each vacuum nozzle 14 from being shortened due to the striking of the end of the vacuum nozzle 14 against the stopper.

Although the cam follower 56 of a type which rolls on the cam surface is employed in the embodiment, this is not limitative, but a cam follower of a normal type which slides on the cam surface may be used.

Further, the cam-rotating motor 50 may be arranged between the nozzle holder 41 and the lower portion of the end cam 48. In this case, the nozzle-rotating motor 45 is driven to rotate the nozzle holder 41 to bring a vacuum nozzle 14 selected for use to a projecting position in advance, and then, in a state of the nozzle-rotating motor 45 being maintained in its energized state, the cam-rotating motor 50 is driven to rotate the cam end 48 to move the nozzle-projecting surface 49a of the end cam 48 to the desired projecting position, thereby causing the selected vacuum nozzle 14 to project at the desired projecting position. In this case, however, it is required to feed electric power to the rotor via a split ring.

Further, although in the above embodiment, the nozzle-rotating motor 45 and the cam-rotating motor 50 are each formed by a stepping motor, this is not limitative, but each of them may be formed by a servomotor. In this case, since encoders incorporated in the respective servomotors are capable of performing respective similar functions to those of the cam encoder 61 and the nozzle encoder 64, it is possible to dispense with the encoders 61, 64. However, even when the servomotors are used, the encoders 61, 64 may be provided for more direct detection of respective rotational positions of the nozzle-projecting surface 49a and a vacuum nozzle 14.

It is further understood by those skilled in the art that the foregoing are preferred embodiments of the invention, and that various changes and modifications may be made without departing from the spirit and scope thereof.

What is claimed is:

1. A mounting head for an electronic component-mounting apparatus, including a nozzle holder having a plurality of vacuum nozzles arranged circumferentially about an axis thereof in a manner such that each vacuum nozzle is capable of projecting from said nozzle holder and retracting in said nozzle holder, a holder support member supporting said nozzle holder in a manner such that said nozzle holder can rotate about said axis thereof, and main rotation drive means for driving said nozzle holder about said axis thereof for rotation in normal and reverse directions, wherein said nozzle holder is rotated by said main rotation drive means to bring one of said vacuum nozzles selected for use to a projecting position, and said selected one is caused to project from a lower end face of said nozzle holder at said projecting position, the mounting head comprising:
a plurality of cam followers mounted at respective upper portions of said vacuum nozzles;
an annular end cam with which said cam followers are in contact in a manner such that said cam followers can move on said annular end cam, said annular end cam being formed with a nozzle-projecting surface for causing said selected one of said vacuum nozzles to project from said lower end face of said nozzle holder when said selected one of said vacuum nozzles is at said projecting position; and
auxiliary rotation drive means for driving said end cam for rotation about an axis of said end cam in normal and reverse directions.

2. A mounting head according to claim 1, wherein said main rotation drive means and said auxiliary rotation drive means are each formed by a stepping motor or a servomotor, said auxiliary rotation drive means being interposed between said holder support member and a lower portion of said end cam.

3. A mounting head according to claim 2, further comprising:

cam position-detecting means for detecting a rotational position of said nozzle-projecting surface of said end cam;

nozzle position-detecting means for detecting a rotational position of each of said vacuum nozzles on said nozzle holder; and control means for controlling rotation of said main rotation drive means and rotation of said auxiliary rotation drive means, in response to respective detection signals from said cam position-detecting means and said nozzle position-detecting means.

4. A mounting head according to claim 2, including an inner bearing and an outer bearing fixedly arranged between said nozzle holder and said holder support member for supporting said lower portion of said end cam in a manner such that said lower portion of said end cam is sandwiched between said inner bearing and said outer bearing, and wherein said end cam has an inner peripheral surface, an outer peripheral surface, and an annular lug formed around at least one of said inner peripheral surface and said outer peripheral surface, said lug abutting from above on a corresponding one of said inner bearing and said outer bearing.

5. A mounting head according to claim 1, further comprising:

cam position-detecting means for detecting a rotational position of said nozzle-projecting surface of said end cam;

nozzle position-detecting means for detecting a rotational position of each of said vacuum nozzles on said nozzle holder; and control means for controlling rotation of said main rotation drive means and rotation of said auxiliary rotation drive means, in response to respective detection signals from said cam position-detecting means and said nozzle position-detecting means.

6. A mounting head according to claim 1, wherein each of said vacuum nozzles has an upper intermediate portion and a support block fixed to said upper intermediate portion, and wherein said cam follower is rotatably supported by said cam follower such that said cam follow is in rolling contact with said end cam.

7. A mounting head according to claim 6, including a passage member secured to an upper end face of said nozzle holder, a nozzle guide member secured to an end of said passage member and having a vacuum passage formed along an axis thereof, and a compression spring interposed between said nozzle guide member and said support block of said each of said vacuum nozzles, said compression spring urging said each of said vacuum nozzles in a protruding direction, and at the same time causing said cam follower to be brought into positive rolling contact with said end cam.

* * * * *